United States Patent [19]

Dahms

[11] Patent Number: 4,975,159

[45] Date of Patent: Dec. 4, 1990

[54] AQUEOUS ACIDIC BATH FOR ELECTROCHEMICAL DEPOSITION OF A SHINY AND TEAR-FREE COPPER COATING AND METHOD OF USING SAME

[75] Inventor: Wolfgang Dahms, Berlin, Fed. Rep. of Germany

[73] Assignee: Schering Aktiengesellschaft, Berlin and Bergkamen, Fed. Rep. of Germany

[21] Appl. No.: 426,877

[22] Filed: Oct. 24, 1989

[30] Foreign Application Priority Data

Oct. 24, 1988 [DE] Fed. Rep. of Germany ....... 3836521

[51] Int. Cl.$^5$ ............................................... C25D 3/38
[52] U.S. Cl. ........................................ 204/15; 204/52.1
[58] Field of Search ................. 204/52.1, 15; 106/1.26

[56] References Cited

U.S. PATENT DOCUMENTS

| | | | |
|---|---|---|---|
| 3,294,578 | 12/1966 | Popeck | 106/1.26 X |
| 4,336,114 | 6/1982 | Mayer et al. | 204/52.1 |
| 4,781,801 | 11/1988 | Frisby | 204/25 |

Primary Examiner—G. L. Kaplan
Attorney, Agent, or Firm—Michael J. Striker

[57] ABSTRACT

The aqueous acidic bath for electrochemical deposition of a shiny and tear-free copper coating, especially for reinforcement of conductive pathways of a printed circuit with outstanding breaking elongation, contains at least one copper salt, at least one inorganic acid and at least one alkoxylated lactam as an amide-group-containing compound. The aqueous acidic bath also includes, as necessary, a compound having a chloride ion, a sulfur-containing organic compound with a solubilizing group and another organic compound selected from a group including polyglycols defined in more detail hereinbelow in Table III.

17 Claims, No Drawings

AQUEOUS ACIDIC BATH FOR ELECTROCHEMICAL DEPOSITION OF A SHINY AND TEAR-FREE COPPER COATING AND METHOD OF USING SAME

BACKGROUND OF THE INVENTION

My invention relates to an aqueous acidic bath for electrochemical deposition of a copper coating, especially a shiny and tear-free copper coating, and a coating for reinforcement of conductive pathways on a printed circuit board with outstanding breaking elongation.

A current aqueous acidic bath for electrochemical deposition of a copper coating or layer comprises at least one copper salt, at least one inorganic acid and, if necessary, a compound having a chloride and an amide group-containing compound, an organic sulfur-containing compound with solubilizing group and, if necessary, another organic compound selected from a group of compounds to be defined more precisely in Table III and the following paragraphs.

It has been known for a long time that organic substances may be added to an electrochemical copper bath to attain a shiny coating. However those additives in many cases lead to a deterioration of mechanical properties of the coating, especially hardness and breaking elongation to a passification or surface inertness, which makes necessary a subsequent activation for further treatment. Moreover many inhibitors impair the metal distribution, so that tears arise at passages and edges, especially when the copper layer in a printed circuit with solder is exposed to a thermal treatment.

The numerous compounds already known for this purpose such as thiourea, thiohydantoic acid, thiocarbamic acid ester or thiophosphoric acid ester, have however no practical importance, since the quality of the copper coating obtained with them, especially in regard to the hardness and the breaking elongation, is very poor. Also a combination of any of these compounds with another additive, such as an ethylene oxide addition compound or polyamine, leads to an unsatisfactory result.

A copper bath containing an acid amide of the general formula R—CO—NH$_2$, in which the R represents an aliphatic or aromatic monomer or a polymeric hydrocarbon group, in combination with an acid containing high-molecular weight compound and an organic sulfur-containing compound with a solubilizing group as described in German Open Patent Application No. 27 46 938 was a significant advance in electrochemical copper bath technology.

This bath has the disadvantage however that it acts optimally only in a very narrow concentration range which frequently does not correspond to what is required in practice. Through-going hole oblateness occurs on exceeding a few milligrams per liter bath solution so that the circuit boards become torn or fractured during later soldering and are unuseable.

Copper coatings of improved shininess and smoothness made from an aqueous acid copper bath containing at least one copper salt, at least one inorganic acid and, if necessary, an aliphatic hydrocarbon compound having a chloride and an acid amide group, an organic sulfur compound with a solubilizing group and another organic compound selected from a group more precisely defined hereinbelow in Table III are described in U.S. Pat. No. 35 02 551.

SUMMARY OF THE INVENTION

It is an object of the present invention to provide an improved electrochemical bath for deposition of smoother copper coatings.

It is another object of the present invention to provide an improved electrochemical bath for reinforcement of conductive pathways of printed circuit boards without tear formation and with outstanding breaking elongation over a wider concentration range.

Accordingly these objects and others are attained in an electrochemical bath of the above-described kind according to our invention which also contains at least one substituted alkoxylated lactam as an amide-group-containing compound in an amount determined by the aims of my invention. The amount of the substituted alkoxylated lactam is chosen which optimizes the shininess and mechanical properties of the copper coating.

The substituted alkoxylated lactam advantageously has the following general formula I:

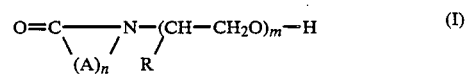

wherein R is methyl or hydrogen,
A is a hydrocarbon residue,
n is a whole number from 2 to 10, advantageously from 2 to 5,
and m is a whole number from 1 to 50.

The hydrocarbon residue, A, is advantageously a —CH$_2$— group.

The alkoxylated lactam can be advantageously chosen from the group consisting of ethoxylated-beta-propiolactam, hexaethoxylated-gamma-butyrolactam, octaethoxylated-delta-valerolactam, pentapropoxylated-delta-valerolactam, hexaethoxylated-epsilon-caprolactam and dodecaethoxylated-epsilon-caprolactam The alkoxylated lactam substituted as necessary is advantageously in a concentration of 0.002 to 3 g/liter although a preferred range is from 0.005 to 0.2 g/liter.

Additionally a brightening and/or wetting agent may be included in the bath.

Various organic sulfur-containing compounds may also be used in the bath. These sulfur containing compounds are advantageously selected from the group consisting of 3-mercaptopropane-1-sulfonic acid, sodium salt; thiophosphoric-0-ethyl-bis-(w-sulfopropyl)-ester, disodium salt; thiophosphoric acid-tris-(w-sulfopropyl)-ester, trisodium salt; thioglycolic acid; ethylenedithiodipropylsulfonic acid, sodium salt; di-n-propyl-thioether-di-w-sulfonic acid, disodium salt; bis(w-sulfopropyl)disulfide, disodium salt; bis(w-sulfohydroxypropyl)disulfide, disodium salt; bis(w-sulfobutyl)-disulfide, disodium salt; bis(p-sulfophenyl)disulfide, sodium salt; methyl-(w-sulfopropyl)disulfide, sodium salt; methyl-(w-sulfobutyl)trisulfide, sodium salt; 3-(benzthiazole-2-thio)propyl sulfonic acid, sodium salt; N,N-dimethyl-dithio-carbamic acid-(3-sulfopropyl)-ester, sodium salt; and O-ethyl-dithiocarbonic acid-S-(3-sulfopropyl)-ester, potassium salt.

Advantageously the sulfur-containing compounds have a concentration of from 0.005 to 0.2 g/liter although an often preferred range is from 0.01 to 0.05 g/liter.

The electrochemical copper bath may also include other organic compounds in a concentration of from 0.005 to 20 g/liter. An often preferred range is from 0.01 to 5 g/liter.

These other organic compounds are selected from the group consisting of polyvinyl alcohol, carboxymethyl cellulose, polyethylene glycol, polypropylene glycol, stearic acid-polyglycol ester, oleic acid-polyglycol ester, stearyl alcohol-polyglycol ether, nonylphenol-polyglycol ether, octanol polyalkenglycol ether, nonylphenol-polyglycol ether, octanol polyalkenglycol ether, octandiol-bis-(polyalkyleneglycol ether), polyoxypropylene glycol, polyethylene-propylene glycol and [(Mixed or Block polymerizate)] beta-naphthol-polyglycol ether.

The electrochemical copper bath according to our invention allows surprisingly an electrochemical deposition of a copper coating with especially uniform shininess over a wide range of concentrations. Moreover surprisingly this bath has the advantage of providing a good metal distribution and an outstanding breaking elongation. Therefore the electrochemical bath according to our invention advantageously may be used for reinforcing the conductive pathways of printed circuit boards.

The individual components used in the electrochemical bath according to our invention appear to act synergistically when used together in the desired way since no satisfactory results are obtained when they are used alone.

The individual components used in the electrochemical bath according to our invention are known and can be made in a known way.

The following table I contains alkoxylated lactams for use in the electrochemical bath and advantageous concentration ranges associated with them:

TABLE I

| Alkoxylated Lactams and Concentration Ranges | |
| --- | --- |
| Alkoxylated Lactam | Concentration, g/l |
| ethoxylated-beta-propiolactam | 0.02–2 |
| hexaethoxylated-gamma-butyrolactam | 0.01–2 |
| octaethoxylated-delta-valerolactam | 0.03–3 |
| pentapropoxylated-delta-valerolactam | 0.01–1 |
| hexaethoxylated-epsilon-caprolactam | 0.02–2 |
| dodecaethoxylated-epsilon-caprolactam | 0.01–1 |

The following Table II contains examples of sulfur-containing compounds with water-solubilizing groups for the electrochemical bath and their associated concentration ranges:

TABLE II

| Sulfur-containing Compounds and Concentrations | |
| --- | --- |
| Sulfur-containing Compound | Often Preferred Concentrations, gram /liter |
| 3-mercaptopropane-1-sulfonic acid, sodium salt | 0.005–0.10 |
| Thiophosphoric-0-ethyl-bis-(w-sulfopropyl)-ester, Disodium salt | 0.01–0.15 |
| Thiophosphoric acid-tris-(w-sulfopropyl)-ester, trisodium salt | 0.02–0.15 |
| Thioglycolic acid | 0.001–0.003 |
| ethylenedithiodipropyl sulfonic acid, sodium salt | 0.01–0.10 |
| Di-n-propyl-thioether-di-w-sulfonic acid, disodium salt | 0.01–0.10 |

TABLE II-continued

| Sulfur-containing Compounds and Concentrations | |
| --- | --- |
| Sulfur-containing Compound | Often Preferred Concentrations, gram /liter |
| Bis(w-sulfopropyl)disulfide, disodium salt | 0.002–0.02 |
| Bis(w-sulfohydroxypropyl) disulfide, Disodium salt | 0.003–0.02 |
| Bis(w-sulfobutyl)disulfide, Disodium salt | 0.004–0.02 |
| Bis(p-sulfophenyl)disulfide, Sodium salt | 0.01–0.1 |
| Methyl-(w-sulfopropyl)disulfide, Sodium salt | 0.007–0.03 |
| Methyl-(w-sulfobutyl)trisulfide, Sodium salt | 0.005–0.02 |
| 3-(benzthiazole-2-thio)propyl sulfonic acid, sodium salt | 0.008–0.04 |
| N,N-Dimethyl-dithiocarbamic acid-(3-sulfopropyl)-ester, sodium salt | 0.003–0.002 |
| O-ethyl-dithiocarbonic acid-S-(3-sulfopropyl)-ester, potassium salt | 0.001–0.015 |

The following Table III contains examples of other organic compounds, which may be used as surfactants and their often preferred concentration ranges:

TABLE III

| Other Organic Compounds | |
| --- | --- |
| Compounds | Concentration Range, g/liter |
| Polyvinyl alcohol | 0.05–0.40 |
| Carboxymethyl cellulose | 0.05–0.10 |
| Polyethylene glycol | 0.10–5.0 |
| Polypropylene glycol | 0.05–1.0 |
| Stearic acid-polyglycol ester | 0.5–8.0 |
| Oleic acid-polyglycol ester | 0.5–5.0 |
| Stearyl alcohol-polyglycol ether | 0.5–8.0 |
| Nonyl phenol-polyglycol ether | 0.5–6.0 |
| Octanol polyalkeneglycol ether | 0.05–0.5 |
| Octandiol-bis-(polyalkyleneglycol ether) | 0.05–0.5 |
| Polyoxypropylene glycol | 0.05–0.5 |
| Polyethylene-propylene glycol (Mixed or Block polymerizate) | 0.02–5.0 |
| beta-Naphthol-polyglycol ether | 0.02–4.0 |

The basic composition in the bath according to the invention can vary in certain limits. Generally an aqueous solution of the following concentrations can be used:

| | |
| --- | --- |
| Copper sulfate(CuSO$_4$.5H$_2$O) | 20–250 g/liter |
| advantageously | 60–100 g/liter |
| | 180–220 g/liter |
| or | |
| Sulfuric acid | 50–350 g/liter |
| advantageously | 180–220 g/liter |
| | 50–90 g/liter |
| or | |
| Chloride ion (in the form of an acid salt or sodium chloride) | 0.02–0.15 g/liter |
| advantageously | 0.025–0.08 g/liter |

Instead of cupric sulfate also other copper salts can be used at least partially. Also sulfuric acid can partially or completely be replaced by fluoroboric acid, methane sulfonic acid or other acids. The addition of chloride ion can be partially or completely omitted, when halogen ions are included in the additives.

Again shininess-building agents, smoothing agents and thiourea derivatives and/or wetting agents can be added to the bath.

In making the bath according to our invention the individual components of the basic composition are added together.

The operating conditions of the electrochemical bath are as follows:

| | |
|---|---|
| pH value | <1 |
| Temperature: | 15–45° C., advantageously 25° C. |
| cathodic current density | 0.5–12 A/dm$^2$, advantageously 2 to 4 A/dm$^2$ |

Electrolyte motion occurs by forcing clean air into the electrolyte so vigorously that ebullition occurs at the electrolyte surface. The electrolyte motion by forced air can be replaced in a few cases by a suitable substrate motion. Copper with a content of 0.02 to 0.067 % can be used as an anode.

The following examples serve to illustrate our invention but their details should not in any way limit the appended claims.

EXAMPLE I

A copper bath composition of the following:
40 g/l copper sulfate(CuSO$_4$.5H$_2$O)
300 g/l conc. sulfuric acid
0.10 g/l hydrochloric acid.
3 mg/liter O-ethyl-dithiocarbonic acid-S (3-sulfopropyl)-ester, potassium salt and
50 mg/liter hexaethoxylated-epsilon-caprolactam are added. The deposition in the electrochemical Hull cell proceeds with a current density of 0.15 A/dm$^2$ to 4 A/dm$^2$. The copper coating is sufficiently shiny.

EXAMPLE II

A basic copper bath of the following composition:
72 g/l copper sulfate(CuSO$_4$.5H$_2$O)
200 g/l conc. sulfuric acid
0.15 g/l 35% hydrochloric acid.
20 mg/l 3-(benzthiazolyl-2-thio)-propylsulfonic acid, sodium salt and
20 mg/l hexaethoxylated-epsilon-caprolactam are added to the basic bath.
One uses a current density of 7 A/dm$^2$ to produce a shiny deposit. After addition of 0.4 g/l of polyethylenepropylene glycol one obtains an outstanding, shiny coating, which continues on the back side of the Hull cell plate.

EXAMPLE III

The basic composition of the copper bath is as follows:
80 g/l copper sulfate(CuSO$_4$.5H$_2$O)
180 g/l sulfuric acid, concentrated
0.08 g/l sodium chloride.
0.6 g/l of polypropylene glycol as a shininess-building additive and 0.02 g/l of 3-mercaptopropane-l-sulfonic acid, sodium salt, are added. With a bath temperature of 30° C. one obtains a dull deposit in a Hull electrochemical cell with a current density of 5 A/dm$^2$ and with a current density of 0.8 A/dm$^2$ below.

One also should put in the bath
0.1 g/l hexaethoxylated-gamma-butyrolactam or
0.05 g/l hexaethoxylated-epsilon-caprolactam or
0.04 g/l octaethoxylated-epsilon-valerolactam or
0.03 g/l dodecaethoxylated-epsilon-caprolactam, so that in the total current density range a shiny deposit form on the Hull cell test plate.

EXAMPLE IV

The basic composition of the copper bath is as follows:
60 g/l copper sulfate(CuSO$_4$.5H$_2$O)
220 g/l sulfuric acid, concentrated
0.10 g/l sodium chloride.
1.0 g/l nonylphenol-polyglycol ether and 0.040 g/l 3-(benzthiazolyl-2-thio)-propylsulfonic acid, sodium salt, are added.

In the exclusively substrate stirred electrochemical bath a printed circuit board coppered according to the additive method is reinforced in 60 minutes with an average current density of 2 A/dm$^2$. After a deposition with the above bath the through-going hole clearly show a halo, which has clearly tears or fractures after plating.

When 50 mg/l of hexaethoxylated-epsilon-caprolactam are added to the bath the through-going hole is satisfactory—even after plating.

EXAMPLE V

A copper foil of 40 m deposited with a current density of 2.5 A/dm$^2$ with the following electrochemical bath:
80 g/l copper sulfate(CuSO$_4$.5H$_2$O)
200 g/l sulfuric acid, concentrated,
0.06 g/liter sodium chloride and
0.4 g/l octanol polyalkylene glycol ether
0.01 g/liter bis(w-sulfopropyl)disulfide, disodium salt shows a breaking elongation of 18%. After addition of 0.05 g/l hexaethoxylated-epsilon-caprolactam fresh copper foil is deposited. The breaking elongation improves to 24%. Further additions of that to the bath do not substantially improve the breaking elongation.

EXAMPLE VI

A copper foil is deposited with a current density of from 0.2 to 7 A/dm$^2$ in a Hull cell with an electrochemical bath containing:
200 g/l copper sulfate(CuSO$_4$.5H$_2$O)
60 g/l sulfuric acid, concentrated,
0.1 g/l (35%) hydrochloric acid
10 mg/l of mercaptopropane sulfonic acid, sodium salt, and
50 mg/l of hexaethoxylated-epsilon-caprolactam are added.

While the invention has been illustrated and described as embodied in an electrochemical copper bath used for making a shiny and tear-free copper coating and method for using same, it is not intended to be limited to the details shown, since some modification and chemical structure change may be made without departing in an way from the spirit of the present invention.

Without further analysis, the foregoing will so fully reveal the gist of the present invention that others can, by applying current knowledge, readily adapt it for various applications without omitting features that, from the standpoint of the prior art, fairly constitute essential characteristics of the generic or specific aspects of this invention.

What is claimed as new and desired to be protected by Letters Patent is set forth in the appended claims:

I claim:

1. An aqueous acidic bath for electrochemical deposition of a shiny and tear-free copper coating, especially for reinforcement of conductive pathways of a printed circuit with outstanding breaking elongation, containing at least one copper salt, at least one inorganic acid and at least one alkoxylated lactam as an amide-group-containing compound.

2. An aqueous acid bath according to claim 1, further comprising a compound having a chloride ion and a sulfur-containing organic compound with a solubilizing group.

3. An aqueous acidic bath according to claim 2, further comprising another organic compound selected from the group consisting of polyvinyl alcohol, carboxymethyl cellulose, polyethylene glycol, polypropylene glycol, stearic acid-polyglycol ester, oleic acid-polyglycol ester, stearyl alcohol-polyglycol ether, nonylphenol-polyglycol ether, octanol polyalkenglycol ether, nonylphenol-polyglycol ether, octanol polyalkenglycol ether, octandiol-bis-(polyalkyleneglycol ether), polyoxypropylene glycol, polyethylene-propylene glycol and beta-naphthol-polyglycol ether.

4. An aqueous acidic bath according to claim 3, in which said other organic compound is present in a concentration of 0.005 to 20 g/l.

5. An aqueous acidic bath according to claim 3, in which said other organic compound is present in a concentration of 0.01 to 5 g/l.

6. A method of reinforcing a conductive pathway of a printed circuit comprising the step of electrochemically depositing a copper coating on said conductive pathway from an aqueous acidic bath according to claim 2.

7. An aqueous acidic bath according to claim 1, in which said alkoylated lactam has the general formula (I):

wherein R is a member selected from the group consisting of methyl and hydrogen, A is a hydrocarbon group, n is a whole number from 2 to 10, and m is another whole number from 1 to 50.

8. An aqueous acidic bath according to claim 7, wherein n is from 2 to 5.

9. An aqueous acidic bath according to claim 7, wherein A is a —$CH_2$— group.

10. An aqueous acidic bath according to claim 1, wherein said alkoxylated lactam is a member selected from the group consisting of ethoxylated beta-propiolactam, hexaethoxylated-gamma-butyrolactam, octaethoxylated-delta-valerolactam, pentapropoxylated-delta-valerolactam, hexaethoxylated-epsilon-caprolactam and dodecaethoxylated-epsilon-caprolactam.

11. An aqueous acidic bath according to claim 1, wherein said alkoxylated lactam is present in a concentration of from 0.002 to 3 g/l.

12. An aqueous acidic bath according to claim 11, wherein said concentration of said alkoxylated lactam is from 0.005 to 0.2 g/l.

13. An aqueous acidic bath according to claim 2, wherein said sulfur-containing organic compound is a member selected from the group consisting of 3-mercaptopropane-l-sulfonic acid, sodium salt; thiophosphoric-0-ethyl -bis-(w-sulfopropyl)-ester, disodium salt; thiophosphoric acid-tris-(w-sulfopropyl)-ester, trisodium salt; thioglycolic acid; ethylenedithiodipropylsulfonic acid, sodium salt; di-n-propyl-thioether-di-w-sulfonic acid, disodium salt; bis(w-sulfopropyl)disulfide, disodium salt; bis(w-sulfohydroxypropyl) disulfide, disodium salt; bis(w-sulfobutyl)disulfide, disodium salt; bis(p-sulfophenyl) disulfide, sodium salt; methyl-(w-sulfopropyl)disulfide, sodium salt; methyl-(w-sulfobutyl)-trisulfide, sodium salt; 3-(benzthiazole-2-thio)propyl sulfonic acid, sodium salt; N,N-dimethyl-dithiocarbamic acid-(3-sulfopropyl)-ester, sodium salt; and O-ethyl-dithiocarbonic acid-S-(3-sulfopropyl)-ester, potassium salt.

14. An aqueous acidic bath according to claim 13, wherein said sulfur-containing organic compound is present in a concentration of from 0.0005 to 0.2 g/l.

15. An aqueous acidic bath according to claim 14, wherein said sulfur-containing organic compound is present in a concentration of from 0.001 to 0.05 g/l.

16. An aqueous acidic bath according to claim 1, further comprising a wetting agent.

17. An aqueous acidic bath according to claim 1, further comprising an additional shininess-building agent.

* * * * *